United States Patent
Jakschik et al.

(10) Patent No.: US 7,851,297 B2
(45) Date of Patent: Dec. 14, 2010

(54) DUAL WORKFUNCTION SEMICONDUCTOR DEVICE

(75) Inventors: Stefan Jakschik, Dresden (DE); Jorge Adrian Kittl, Waterloo (BE); Marcus Johannes Henricus van Dal, Leuven (BE); Anne Lauwers, Aartselaar (BE); Masaaki Niwa, Osaka-fu (JP)

(73) Assignee: IMEC, Leuven (BE)

( * ) Notice: Subject to any disclaimer, the term of this patent is extended or adjusted under 35 U.S.C. 154(b) by 54 days.

(21) Appl. No.: 12/145,413

(22) Filed: Jun. 24, 2008

(65) Prior Publication Data

US 2009/0020821 A1    Jan. 22, 2009

(30) Foreign Application Priority Data

Jun. 25, 2007    (EP)    .................... 07012357

(51) Int. Cl.
*H01L 21/8238*    (2006.01)
(52) U.S. Cl. ............... 438/218; 257/369; 257/E21.635
(58) Field of Classification Search ............... 257/213, 257/E21.635; 438/218
See application file for complete search history.

(56) References Cited

U.S. PATENT DOCUMENTS

| | | | |
|---|---|---|---|
| 6,372,557 B1 * | 4/2002 | Leong ............... | 438/142 |
| 6,864,163 B1 | 3/2005 | Yu | |
| 7,479,683 B2 * | 1/2009 | Bojarczuk et al. .......... | 257/410 |
| 2006/0046523 A1 * | 3/2006 | Kavalieros et al. .......... | 438/791 |
| 2006/0131652 A1 | 6/2006 | Li | |
| 2006/0263961 A1 * | 11/2006 | Kittl et al. ................... | 438/199 |
| 2007/0059872 A1 * | 3/2007 | Visokay et al. ............. | 438/197 |
| 2007/0093015 A1 * | 4/2007 | Kudo et al. ................. | 438/199 |
| 2008/0191289 A1 * | 8/2008 | Pas et al. ..................... | 257/401 |

FOREIGN PATENT DOCUMENTS

| | | |
|---|---|---|
| EP | 1724818 A | 11/2006 |
| EP | 1724828 A | 11/2006 |
| WO | WO 2007/009846 A | 1/2007 |

OTHER PUBLICATIONS

Kittl, et al., Ni- and Co-based silicides for advanced CMOS applications, Microelectronic Engineering, MAM 2003: Proceedings of the European Workshop on Materials for Advanced Metallization 2003, La Londe Les Maures, France, Mar. 9-12, 2003, vol. 70, No. 2-4, pp. 158-165.
European Search Report dated Sep. 26, 2007 for European Patent Application No. 07012357.

* cited by examiner

*Primary Examiner*—W. David Coleman
*Assistant Examiner*—Christine Enad
(74) *Attorney, Agent, or Firm*—Knobbe Martens Olson & Bear LLP (57) ABSTRACT

A dual workfunction semiconductor device which comprises a first and second control electrode comprising a metal-semiconductor compound, e.g. a silicide or a germanide, and a dual workfunction semiconductor device thus obtained are disclosed. In one aspect, the method comprises forming a blocking region for preventing diffusion of metal from the metal-semiconductor compound of the first control electrode to the metal-semiconductor compound of the second control electrode, the blocking region being formed at a location where an interface between the first and second control electrodes is to be formed or is formed. By preventing metal to diffuse from the one to the other control electrode the constitution of the metal-semiconductor compounds of the first and second control electrodes may remain substantially unchanged during e.g. thermal steps in further processing of the device.

18 Claims, 4 Drawing Sheets

DUAL WORKFUNCTION SEMICONDUCTOR DEVICE

BACKGROUND OF THE INVENTION

1. Field of the Invention

The present invention relates to dual workfunction semiconductor devices. More particularly the present invention relates to dual workfunction semiconductor devices having fully silicidized control electrodes. The present invention provides a method for forming dual workfunction semiconductor devices and dual workfunction semiconductor devices thus obtained.

2. Description of the Related Technology

Nowadays CMOS devices are scaling down more and more. In today's CMOS devices the sizes of, for example, gate electrodes become so small that control of charges in a channel of a CMOS device through gate voltage is suppressed by depletion charges in source and drain regions. In order to limit this suppression, capacitance per unit area of the gate electrode may be increased or leakage current may be decreased by using a high-k dielectric material as a gate dielectric. A further improvement may be achieved by using, for example, metal electrodes instead of polysilicon (Poly-Si) electrodes for forming the gate electrode. Through this, depletion effects which typically occur in Poly-Si may be eliminated. Replacing Poly-Si gate electrodes by gate electrodes comprising a metal has two important advantages, i.e. sheet resistance and equivalent electrical thickness of the gate dielectric may be lowered. To replace Poly-Si gate electrodes FUSI (fully silicidized) gate electrodes form a good alternative for metal gate electrodes.

In "Ni and Co based silicides for advanced CMOS applications" (Materials for Advanced Metallization, MAM 2003: Proceedings of the European Workshop on Materials for Advanced Metallization 2003, La Londe Les Maures, France, Mar. 9-12, 2003, vol. 70, no. 2-4, pp. 158-165), J. A. Kittl et al. studied behavior of Co, Co—Ni and Ni silicides in sub-40 nm gate length CMOS technologies with sub-100 nm junction depts. It was found that NiSi has good scaling behavior. NiSi maintains low sheet resistances down to the small gate lengths of about 30 nm. It was furthermore found that Ge pre-amorphization implants before silicidation accelerate the silicidation reaction while N pre-implantation before silicidation slows down the silicidation reaction.

In dual workfunction CMOS devices a PMOS and NMOS device are integrated on a same substrate, adjacent each other. In case the CMOS devices comprise FUSI gates, the PMOS and NMOS devices may comprise different silicide phases providing a different workfunction to the gate electrodes of the PMOS and NMOS. With a silicide phase, a predetermined type of a particular metal silicide is meant, i.e. metal rich (silicon poor) or metal poor (silicon rich) silicide. For example, in case nickel silicide is used to form the gate electrodes a first nickel silicide phase, e.g. $Ni_2Si$ or $Ni_{31}Si_{12}$, may be used for forming the gate electrode of the PMOS and a second nickel silicide phase, e.g. NiSi, may be used to form the gate electrode of the NMOS. Because of the scaling down of these devices, in dual workfunction CMOS devices the different silicide phases of the gates of the PMOS and the NMOS may come in close contact at the transition from NMOS to PMOS. The diffusion length of the metal, in the example given Ni, in the silicides can lead to a change in phase of the gate electrodes and hence a change in threshold voltage $V_t$ of the device. In case of thermal steps being performed in the manufacturing process of the CMOS device after formation of the gates (e.g. a baking step at 400° C.), the metal, in the example given Ni, can diffuse between the gate electrodes of the PMOS and NMOS, and thus modify the optimum phase of the PMOS and NMOS devices. This issue is especially severe in SRAM structures where the minimum distance between NMOS and PMOS devices can be as small as 40 nm.

SUMMARY OF CERTAIN INVENTIVE ASPECTS

Certain inventive aspects relate to a method for manufacturing a dual workfunction semiconductor device and to provide a dual workfunction semiconductor device thus obtained.

By preventing diffusion of metal of the silicide of one control electrode to the silicide of the other control electrode, functioning of a dual workfunction semiconductor device formed by the method according to embodiments of the invention may be reliable. Furthermore, functioning of a dual workfunction semiconductor device formed by the method according to embodiments of the invention may be made good, even better than functioning of a dual workfunction semiconductor device formed by a prior art method, and may even be optimized. Preventing diffusion of metal of the silicide of one control electrode to the silicide of the other control electrode prevents the threshold voltage of the device to be changed, which leads to good and reliable performance of the dual workfunction semiconductor device formed by the method according to embodiments of the invention.

In a first aspect, the present invention provides a method for manufacturing a dual workfunction semiconductor device. The method comprises:

forming on a substrate a first and second control electrode, the first control electrode being formed of a metal-semiconductor compound having a first workfunction and the second control electrode being formed of a metal-semiconductor compound having a second workfunction different from the first workfunction, and forming a blocking region for preventing diffusion of metal from the metal-semiconductor compound of the first control electrode to the metal-semiconductor compound of the second control electrode, the blocking region being located at an interface between the first and second control electrodes.

In particular embodiments, a method according to the first aspect of the present invention comprises:

forming a first and second silicidized, e.g. fully silicidized, or germanidized, e.g. fully germanidized, control electrode on a substrate, the first control electrode being formed of a metal silicide or metal germanide having a first workfunction and the second control electrode being formed of a metal silicide or a metal germanide having a second workfunction different from the first workfunction, and forming a blocking region for preventing diffusion of metal from the metal silicide or metal germanide of the first control electrode to the metal silicide or metal germanide of the second control electrode, the blocking region being formed before, during or after silicidation or germanidation at the location where an interface between the first and second control electrodes will be formed or are formed.

An advantage of the method according to embodiments of the invention is that, by preventing diffusion of metal of the metal-semiconductor compound, e.g. silicide or germanide, of one control electrode to the metal-semiconductor compound, e.g. silicide or germanide, of the other control electrode, functioning of a dual workfunction semiconductor device formed by the method according to embodiments of the invention may be reliable and good, even improved or even optimized with respect to prior art devices. Furthermore, the threshold voltage of the resulting device is not influenced during further processing as no metal diffusion between the first and second control electrode takes place, and thus the threshold voltage has a value which was desired when processing was started.

For obtaining a first and second type of control electrode, the first and second type being different from each other, metal-semiconductor compounds, e.g. silicides or germanides, with different metal content should be formed. Metal-semiconductor compounds, e.g. silicides or germanides, with different metal content may be obtained by thermally reacting a semiconductor with a same type of metal but at different concentrations, or by thermally reacting a semiconductor layer with different types of metal.

According to some embodiments of the invention, forming a first and second control electrode may be performed by:
  providing a first and second control electrode each comprising a stack of a dielectric layer and a semiconductor layer,
  thinning the semiconductor layer of one of the first or second control electrode; this may include thinning the semiconductor layer of both the first and the second control electrode, but thinning the semiconductor layer of one of the control electrodes more than the semiconductor layer of the other control electrode,
  providing a metal layer at least over the first and second control electrodes, and
  thermally reacting the metal layer and the semiconductor layer so as to form the metal-semiconductor compound of the first and second control electrode.

By thinning the semiconductor layer of one of the first or second control electrodes, so that the semiconductor layer of one of the first or second control electrodes is thinner than the semiconductor layer of the other of the control electrodes, and providing a metal layer having a same thickness over both the first and second control electrode, the metal/semiconductor ratio of the metal-semiconductor compound formed in the control electrode that was first, or most, thinned will be higher than the metal/semiconductor ratio in the other control electrode which was not, or less, thinned. In that way, metal-semiconductor compounds, e.g. silicides or germanides, can be formed with a different work function and thus two different types of control electrodes can be formed.

According to other embodiments, forming a first and second control electrode may be performed by:
  providing a first and second control electrode each comprising a stack of a dielectric layer and a semiconductor layer,
  providing a first metal layer with a first thickness over the first control electrode and providing a second metal layer with a second thickness over the second control electrode, the first thickness being different from the second thickness, and
  thermally reacting the metal layer and the semiconductor layer so as to form the metal-semiconductor compound of the first and second control electrode.

By providing a metal layer of same metal type, but with different thickness on the first and second control electrode, control electrodes comprising a metal-semiconductor compound may be obtained with a different metal/semiconductor ratio. In that way metal-semiconductor compounds, e.g. silicides or germanides, can be formed with a different work function and thus two different types of control electrodes can be formed. For example, when the first metal layer has a thickness higher than the second metal layer, the metal-semiconductor compound, e.g. silicide or germanide, of the first control electrode will have a higher metal/semiconductor ratio than the metal-semiconductor compound, e.g. silicide or germanide, of the second control electrode.

According to still other embodiments, forming a first and second control electrode may be performed by:
  providing a first and second control electrode each comprising a stack of a dielectric layer and a semiconductor layer,
  providing a first metal layer of a first metal type over the first control electrode and providing a second metal layer of a second metal type over the second control electrode, the first metal type being different from the second metal type, and
  thermally reacting the metal layer and the semiconductor layer so as to form the metal-semiconductor compound of the first and second control electrode.

By providing first and second metal layers of a different metal type on the first and second control electrode, respectively, metal-semiconductor compounds, e.g. silicides or germanides, can be formed with a different work function and thus two different types of control electrodes can be formed. In this embodiment, one of the semiconductor layers can be thinned more than the other before applying the metal layers, and/or the metal layers may have different thicknesses.

According to embodiments of the present invention, forming a blocking region may be performed by implantation of dopant elements, also referred to as diffusion retarding species, having a solubility in the metal-semiconductor compound, e.g. silicide or germanide, which is lower than the solubility of the metal the metal-semiconductor compound is formed of. An advantage hereof is that the dopant elements or diffusion retarding species will diffuse toward grain boundaries of the metal-semiconductor compounds, e.g. silicides or germanides, and there prevent the metal from diffusing from one metal-semiconductor compound, e.g. silicide or germanide, to another.

Implantation of dopant elements may be performed in a region at the interface between the first and second control electrodes comprising a metal-semiconductor compound.

According to embodiments of the invention, the dual workfunction semiconductor device may comprise a first type of device having a first active area and a second type of device having a second active area, and implantation of dopant elements may be performed by:
  providing a mask which covers the first and second active areas of the first and second type of device but exposes a region at the interface between the first and second control electrodes, and
  implanting dopant elements in the region where the interface between the first and second control electrodes will be formed or is formed.

Implanting dopant elements can be performed by classic techniques such as ion implantation, or can be performed by PLAD (plasma deposition) or any other technique suitable for implanting dopant elements.

According to embodiments of the invention a blanket implantation of dopant elements is performed. Implantation of these dopant elements can be done uniformly, as long as and in a concentration such that they do not affect the workfunction of the metal-semiconductor compound, e.g. silicide or germanide, formed.

According to embodiments of the invention, implantation of dopant elements may be performed after thermally reacting the metal layer and the semiconductor layer so as to form the metal-semiconductor compound of the first and second control electrodes. An additional heating step may then be performed for diffusion of the dopant elements towards the interface between the metal-semiconductor compounds, e.g. silicides or germanides, of the first and second control electrodes. This additional heating step may be a heating step in a subsequent process step or may be a heating step specifically for the purpose of diffusion of the dopant elements.

According to other embodiments of the invention, implantation of dopant elements may be performed during thermally reacting the metal layer and the semiconductor layer so as to form the metal-semiconductor compound of the first and second control electrodes. Diffusion of the dopant elements towards the interface between the metal-semiconductor compounds, e.g. silicides or germanides, of the first and second control electrodes may then occur when heating the substrate during metal-semiconductor compound, formation.

According to still other embodiments of the invention, implantation of dopant elements may be performed before thermally reacting the metal layer and the semiconductor layer so as to form the metal-semiconductor compound of the first and second control electrode. Diffusion of the dopant elements towards the interface between the metal-semiconductor compounds, e.g. silicides or germanides, of the first and second control electrodes may then occur when heating the substrate during metal-semiconductor compound formation. According to embodiments of the invention, implantation of dopant elements may be performed after deposition of a layer of metal-semiconductor compound forming metal. According to further embodiments, the first and second control electrode may each comprise a stack of a dielectric layer and a semiconductor layer and implantation of dopant elements may be performed by implanting dopant elements in the semiconductor layer of the first and second control electrode, before a layer of metal-semiconductor compound forming metal is deposited over the semiconductor layer to form the metal-semiconductor compound, e.g. silicide or germanide.

Implantation of dopant elements may be performed with an implantation dose of between about $1E14$ cm$^{-2}$ and $1E16$ cm$^{-2}$, preferably between about $1E15$ cm$^{-2}$ and $5E15$ cm$^{-2}$. For example, in case of boron which diffuses fast in the semiconductor material of the control electrodes, lower doses around $1E14$ cm$^{-2}$ may be enough whereas in case of N or C, higher doses of between about $1E15$ cm$^{-2}$ and $1E16$ cm$^{-2}$ may be used.

According to embodiments of the invention, the dual workfunction semiconductor device may comprise an NMOS and a PMOS device and the method may furthermore comprise providing isolation zones for electrically isolating the NMOS device from the PMOS device.

According to embodiments of the invention, the dual workfunction semiconductor device may comprise an NMOS and a PMOS device and the method may furthermore comprise providing a first and second main electrode to the NMOS and the PMOS devices.

In a second aspect, the present invention provides a dual workfunction semiconductor device comprising:

a first control electrode formed of a metal-semiconductor compound, e.g. silicide or germanide, having a first workfunction, a second control electrode formed of a metal-semiconductor compound, e.g. silicide or germanide, having a second workfunction, and a blocking region between the first and second control electrodes for preventing diffusion of metal from the metal-semiconductor compound of the first control electrode to metal-semiconductor compound of the second control electrode.

An advantage of the dual workfunction semiconductor device according to embodiments of the invention is that it functions in a reliable and good way.

The blocking region may have a width (w) of between about 10 nm and 40 nm.

Preferably, the metal-semiconductor compound may be a metal silicide, e.g. may be nickel silicide. According to certain embodiments of the invention, the first control electrode may comprise $Ni_2Si$ or $Ni_{31}Si_{12}$ and the second control electrode may comprise NiSi.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

In the different figures, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, over, and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

It will be clear for a person skilled in the art that certain embodiments are also applicable to similar devices that can be configured in any transistor technology, including for example, but not limited thereto, CMOS, BICMOS, Bipolar and SiGe BICMOS technology. Furthermore the findings described herein are explained with reference to PMOS and NMOS transistors as an example, but certain embodiments include within their scope a complementary device whereby PMOS and NMOS transistors become NMOS and PMOS transistors, respectively. A skilled person can make such modifications without departing from the true spirit of the invention.

Embodiments of the present invention provide a method for manufacturing a dual workfunction semiconductor device comprising a first and a second type of semiconductor device, the first and second type being opposite to each other. Embodiments of the present invention also provide a dual workfunction semiconductor device thus obtained.

A problem that may arise with dual workfunction semiconductor devices is that, due to a difference in metal concentration between two regions, e.g. between an n-type and a p-type region, metal may diffuse from a region with higher metal concentration to the other region with a lower metal concentration. This metal diffusion can occur during metal-semiconductor compound formation, e.g. silicide or germanide formation or thereafter, during further processing steps of the device. The metal diffusion may lead to formation of incorrect metal-semiconductor compounds, e.g. silicides or germanides. With incorrect metal-semiconductor compounds is meant metal-semiconductor compounds with another metal/semiconductor ratio than was intended, e.g. insufficient metal in one, too much in the other. As the metal/semiconductor ratio, or in other words the amount of metal required to form a particular type of metal-semiconductor compound, depends inter alia on the work function needed for a particular application, this may lead to metal-semiconductor compounds with another work function than was required and thus to other devices or to devices working differently, for example having different resistivity changes, than was required.

Therefore, the method according to embodiments of the present invention comprises:

forming a first and second control electrode on a substrate, the first control electrode being formed of a metal-semiconductor compound, e.g. a silicide or a germanide, having a first workfunction and the second control electrode being formed of a metal-semiconductor compound, e.g. a silicide or a germanide, having a second workfunction different from the first workfunction, and forming a blocking region for preventing diffusion of metal from the metal-semiconductor compound, e.g. silicide or germanide, of the first control electrode to the metal-semiconductor compound, e.g. silicide or germanide, of the second control electrode, the blocking region being formed before, during or after formation of the metal-semiconductor compound at the location where an interface between the first and second control electrodes will be formed or are formed.

According to embodiments of the invention, blocking regions may be formed before, during or after formation of the first and second control electrodes comprising a metal-semiconductor compound. According to embodiments of the invention, forming of blocking regions may be performed by implantation of dopant elements followed by a heating step. According to embodiments of the invention, implantation of dopant elements or diffusion retarding species (see further) may be done in a semiconductor layer prior to metal-semiconductor compound formation, e.g. silicide or germanide formation. This implantation can be done before depositing a metal-semiconductor compound forming metal onto the semiconductor layer, i.e. directly into the semiconductor layer, or after depositing the metal-semiconductor compound forming metal, i.e. through this metal-semiconductor compound forming metal. According to other embodiments of the invention, blocking regions may be formed after formation of the first and second control electrodes by, for example, providing dopant elements or diffusion retarding species at an interface between the first and second control electrodes. The blocking regions prevent diffusion of metal from the metal-semiconductor compound, e.g. silicide or germanide, of the first control electrode to the metal-semiconductor compound, e.g. silicide or germanide, of the second control electrode during heating steps involved in further processing.

According to certain embodiments, the same metal may be used for forming both the first and second control electrodes. In these cases, the metal may be provided, e.g. deposited, as a single layer of metal over the semiconductor layer to react therewith during thermal reaction with the semiconductor layer so as to form the metal-semiconductor compound. To create a metal concentration difference between the first and second control electrodes, or in other words, to form different metal-semiconductor compounds, e.g. silicides or germanides, in the first and second control electrodes, either the metal layer or the semiconductor layer can have a different thickness. This difference in thickness may, for example, be obtained by either deposition of layers with different thickness or by local thinning of the layers after deposition. In these cases, the first control electrode may comprise a first concentration of metal and the second control electrode may comprise a second concentration of metal, different from the first concentration of metal.

According to other embodiments, different metals may be used to form the first and second control electrodes. In that case, there may always be a concentration gradient for each metal between the two control electrodes.

By preventing diffusion of metal of the metal-semiconductor compound, e.g. silicide or germanide, of one control electrode to the metal-semiconductor compound, e.g. silicide or germanide, of the other control electrode, functioning of a dual workfunction semiconductor device comprising the devices comprising the control electrodes, e.g. a dual workfunction semiconductor device formed by the method according to embodiments of the invention, may be reliable and good. The functioning may be improved compared to the functioning of a prior art dual workfunction semiconductor device, even optimized. Furthermore, the threshold voltage of the resulting device is not influenced during further processing as no metal diffusion between the first and second control electrode takes place. Thus the threshold voltage at the end of the processing has a value which is the value which was desired when processing was started.

The method according to embodiments of the invention may be used for forming planar devices as well as for forming three-dimensional devices. For the purpose of illustration, planar devices will be used. It has to be understood that this is not intended to limit the invention in any way.

Hereinafter, subsequent steps in the method according to embodiments of the invention will be described detail. The method will be described by means of a CMOS (complementary metal-oxide-semiconductor) device comprising a PMOS and an NMOS device each having a gate electrode, a source and a drain region. It has to be understood that this is only for the purpose of illustration and that the method may also be applied for any other semiconductor device having a control electrode and a first and second main electrode.

Furthermore, certain embodiments will be described using silicon as a material the control electrodes are formed of before thermally reacting with the metal layer to form the metal-semiconductor compound. In particular this step is called silicidation, and the formed compound is a silicide. However, these embodiments may also be applied to any semiconductor material, suitable for thermally reacting with metal to form metal-semiconductor compounds, such as SiGe or Ge semiconductor layers, which respectively form germanosilicide and germanide upon thermal reaction with a metal. Again, the above examples are not intended to limit the invention in any way.

In a first step, a substrate 1 may be provided. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer.

In a next step isolation zones 2 may be provided for isolating the still to be formed, NMOS and PMOS devices from each other. The isolation zones 2 may, for example, be shallow trench isolation (STI) zones or thermally grown field oxide (LOCOS—Local Oxidation of Silicon) regions. In one embodiment, STI zones are preferred over LOCOS regions as they can be formed in a smaller dimension than that of the LOCOS regions, which allows the reduction of the device dimensions, so that device density on the substrate 1 can be increased. Therefore, in the following description, only STI zones 2 are further considered, but it should be understood that the present invention includes the process steps described below carried out with other isolation zones 2, such as for example LOCOS regions as well.

Figure 1:
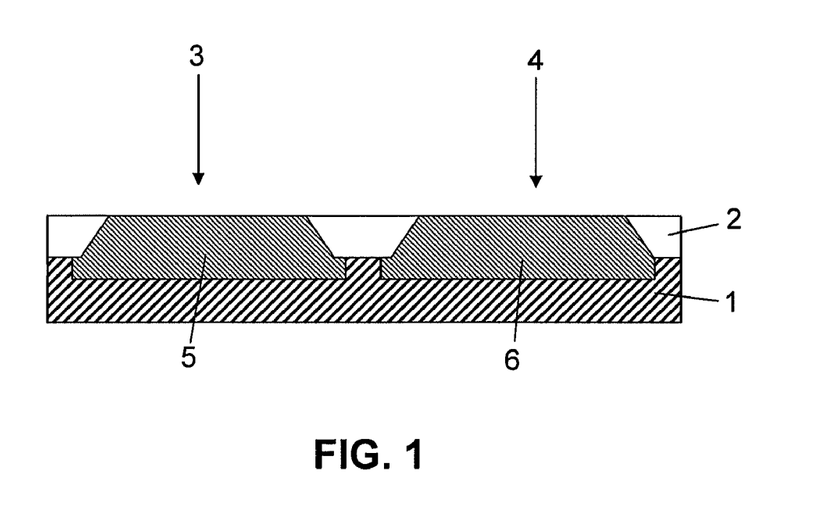
FIG. 1 to FIG. 6 illustrate cross-sections of devices during method steps according to embodiments of the present invention.

According to certain embodiments, as illustrated in FIG. 1, a substrate 1 may be provided with STI zones 2. STI zones 2 may be formed by initially creating a shallow trench in the semiconductor substrate 1, e.g. by a conventional photolithographic and anisotropic etch process such as a dry etch process, e.g. reactive ion etching (RIE) procedure, using e.g. $Cl_2$ as etchant. The shallow trench may be created to a depth of, for example, between about 200 to 600 nm in the semiconductor substrate 1. After removal of the photoresist pattern used for shallow trench definition, e.g. by plasma oxygen ashing and careful wet cleans, an insulating layer such as a silicon oxide layer may be deposited, for example by a low pressure chemical vapor deposition (LPCVD) procedure or by a plasma enhanced chemical vapor deposition (PECVD) procedure or other procedure, to a thickness between about 300 to 1500 nm. The shallow trenches are thus completely filled. Removal of the insulating material, silicon oxide in the example given, from regions other than inside the shallow trenches may be accomplished using any suitable technique such as either a chemical mechanical polishing (CMP) procedure, or via a RIE procedure using a suitable etchant, resulting in insulator filled STI zones 2.

If instead of STI zones 2, LOCOS isolation zones would be provided in the substrate 1, they may be formed via initially forming an oxidation resistant mask, such as silicon nitride, then exposing regions of the semiconductor substrate not protected by the silicon nitride masking pattern, to a thermal oxidation procedure. LOCOS isolation zones are thus created at a thickness equal to the depth of STI regions 2. After formation of the LOCOS region, the oxidation resistant mask is removed.

By forming the STI regions 2, active areas 3 and 4 are defined in the remaining substrate between two STI zones 2. Active areas 3, 4 are the areas where respectively the NMOS and the PMOS device will be formed.

In a next step, channels 5 and 6 of respectively the NMOS and PMOS device may be formed. This may be done by implantation of suitable dopants in the substrate 1 at the location in between the STI zones 2 (see FIG. 1).

Onto the substrate 1 a dielectric layer 7 is then provided. The dielectric layer 7 may comprise any suitable dielectric material such as, for example, $SiO_2$, $Si_3N_4$, $TiO_2$, $HfO_2$. Providing the dielectric layer 7 may be done by any known suitable deposition technique such as e.g. chemical vapor deposition (CVD). The dielectric layer 7 may, for example, have a thickness of between about 0.5 nm and 5 nm. The dielectric layer 7 will later serve as the dielectric layer 7 of the gate electrodes of the NMOS and PMOS devices. Onto the dielectric layer 7 a polysilicon layer 8 is deposited. This may be done by any suitable technique known by a person skilled in the art such as e.g. by CVD. The polysilicon layer 8 may, for example, have a thickness of between about 50 and 200 nm and may typically be about 100 nm.

Figure 2:
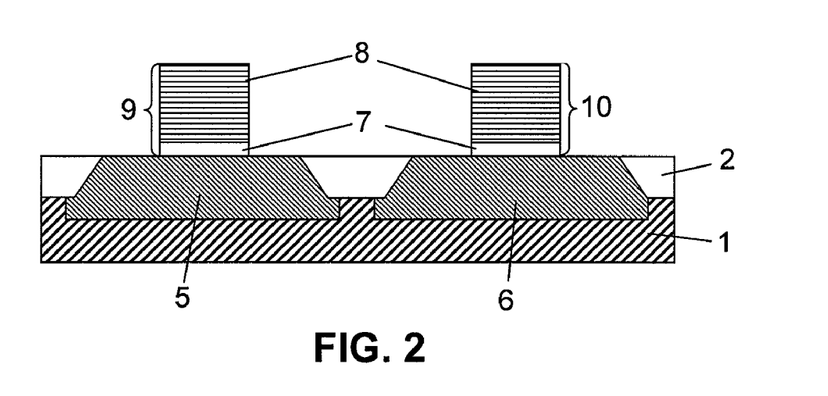

In a next step, the stack formed by the dielectric layer 7 and the polysilicon layer 8 may be patterned. This may be done by any suitable patterning technique, for example, by providing an oxide hardmask and by subsequent etching of parts not covered by the hardmask. In this step, gate electrode 9 of the NMOS device and gate electrode 10 of the PMOS device are formed, each of the gate electrodes 9, 10 comprising a dielectric layer 7 and a polysilicon layer 8 (see FIG. 2).

Next, drain and source extensions 11 may be formed in the substrate 1, adjacent the gate electrodes 9, 10. This may be done by implantation of suitable dopant elements while using the formed gate electrodes 9, 10 as a mask. Then, spacers 12, which may preferably comprise insulating material such as $Si_3N_4$, may be formed. This may be done by depositing and patterning an insulating layer, e.g. a $Si_3N_4$ layer. The spacers 12 may then be used as a mask for performing an implantation to form drain regions 13 and source regions 14 (see FIG. 3). The spacers 12 may, for example in 45 nm CMOS technology, have a size between about 20 nm and 100 nm.

In a next step, drain regions 13 and source regions 14 may be silicidized and provided with source and drain contacts (not shown in the figures). Silicidizing the drain regions 13 and source regions 14 may be performed as follows. First, a suitable metal layer may be deposited onto the drain and source regions 13, 14. With a suitable metal layer is meant a layer of a metal able to react with the silicon so as to form a silicide for the drain and source regions 13, 14. Then, a low temperature step, i.e. heating the substrate 1 to a temperature between about 300° C. and 400° C. may be performed. Next, unreacted metal may be selectively removed by any suitable technique known by a person skilled in the art. After removal of the unreacted metal, a second, higher temperature step may be performed to form a desired silicide, i.e. a silicide with a desired metal/silicon ratio. The second, higher temperature step may be performed at a temperature of about 500° C. Providing the drain and source regions 13, 14 with respectively drain and source contacts may be performed by providing a conductive material, preferably a metal, onto the drain and source regions 13, 14.

Figure 3:
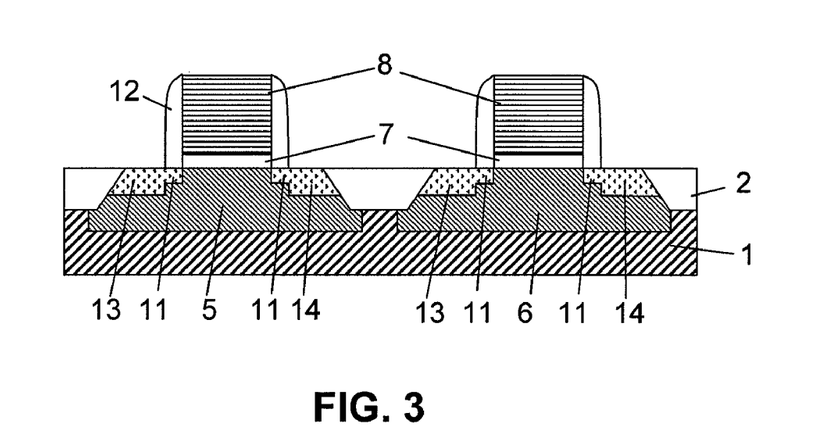
Figure 4:
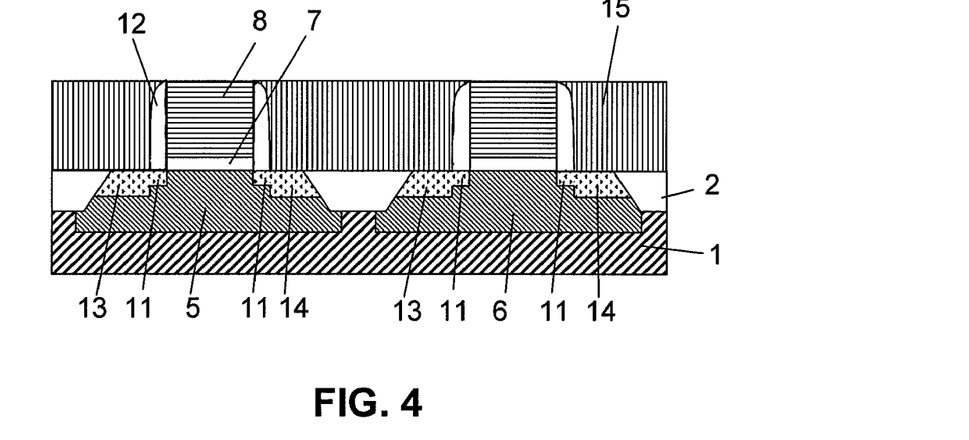

In a subsequent step, an insulating layer, e.g. an oxide layer 15, for example a $SiO_2$ layer, may be provided such that the whole structure as formed up till now and as illustrated in FIG. 3 is covered with the insulating layer, e.g. oxide layer 15. The insulating layer, e.g. oxide layer 15 may follow the structure of the device up till now. Therefore, the insulating layer, e.g. oxide layer 15 may then be planarized by, for example, chemical mechanical polishing (CMP). Next, the insulating layer, e.g. oxide layer 15, may be thinned down up to a height equal to the height of the gate electrodes 9, 10. In other words, the insulating layer, e.g. oxide layer 15, is thinned down until the polysilicon 8 of the gate electrodes 9, 10 is exposed. This may be done by performing, for example, a dry or wet etching step. FIG. 4 illustrates the structure obtained after planarizing and thinning down the insulating layer, e.g. oxide layer 15.

It is known that for obtaining a silicide with a workfunction suitable for forming a p-type device, a metal rich silicide has to be formed. On the other hand, for obtaining a silicide with a workfunction suitable for forming an n-type device, a silicon rich silicide has to be formed. Therefore, before silicidizing the gate electrodes 9, 10 the polysilicon 8 of the gate electrode 10 of the p-type device to be formed may be thinned down from, for example, about 100 nm to 50 nm or 30 nm, depending on the required contents of metal in the silicide, such that when performing the silicidation step, a metal rich silicide will be formed in the gate electrode 10 of the PMOS device. For thinning down the PMOS gate electrodes, first a mask is provided onto the polysilicon 8 of the NMOS device. Then, the polysilicon of the PMOS device is etched to a required thickness. The mask may then be removed by any suitable technique known by a person skilled in the art.

Figure 5:
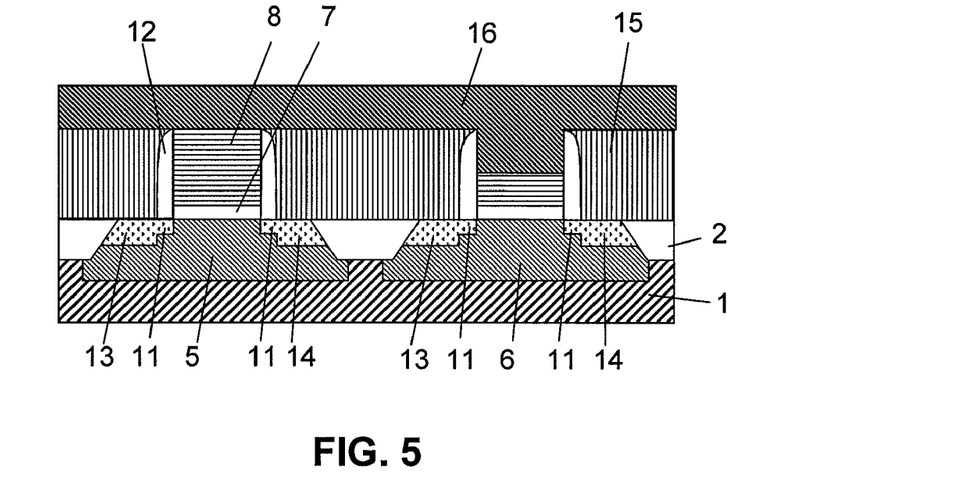
Figure 6:
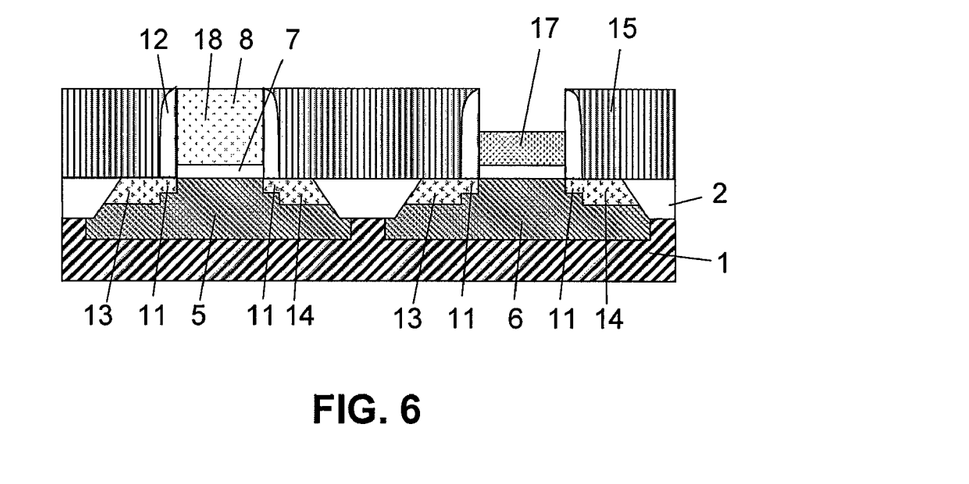

In a next step, the gate electrodes 9, 10 are silicidized. For this purpose, a metal layer 16 may be deposited on top of the structure as obtained so far such that it at least covers the first and second gate electrode 9, 10 (see FIG. 5). The metal layer 16 may comprise any suitable metal for forming a silicide with the polysilicon, such as for example Ni, Hf, Ta, Ti or Co, and may have a thickness of between about 10 and 100 nm. The structure may then be heated during a low temperature step, to a temperature between about 300° C. and 400° C., such that the metal layer 16 and the polysilicon 8 of the gate electrodes 9, 10 react with each other to form a silicide. Next, unreacted metal may be selectively removed by any suitable technique known by a person skilled in the art. After removal of the unreacted metal, a second, higher temperature step may be performed to form a metal rich silicide 17 at the location of the PMOS device and a metal poor or silicon rich silicide 18 at the location of the NMOS device (see FIG. 6). The second, higher temperature step may be performed at a temperature of about 500° C. After heating the structure under the high temperature step, preferably fully silicidized gate electrodes 17, 18 are formed, i.e. all polysilicon of the gate electrodes 9, 10 is transformed into silicide.

It has to be noted that, according to other embodiments of the invention, instead of first thinning down one of the first and second gate electrode 9, 10 and then depositing a metal layer over the first and second gate electrode 9, 10, a metal layer 16 of different thickness may be provided on the first and second gate electrode 9, 10, respectively. For example, a metal layer 16 with a first thickness may be provided on the gate electrode 10 to form a metal rich silicide for the p-type device and a metal layer 16 with a second thickness, lower than the first thickness, may be provided on the gate electrode 9 to form a silicon rich silicide for the n-type device.

Figure 7:
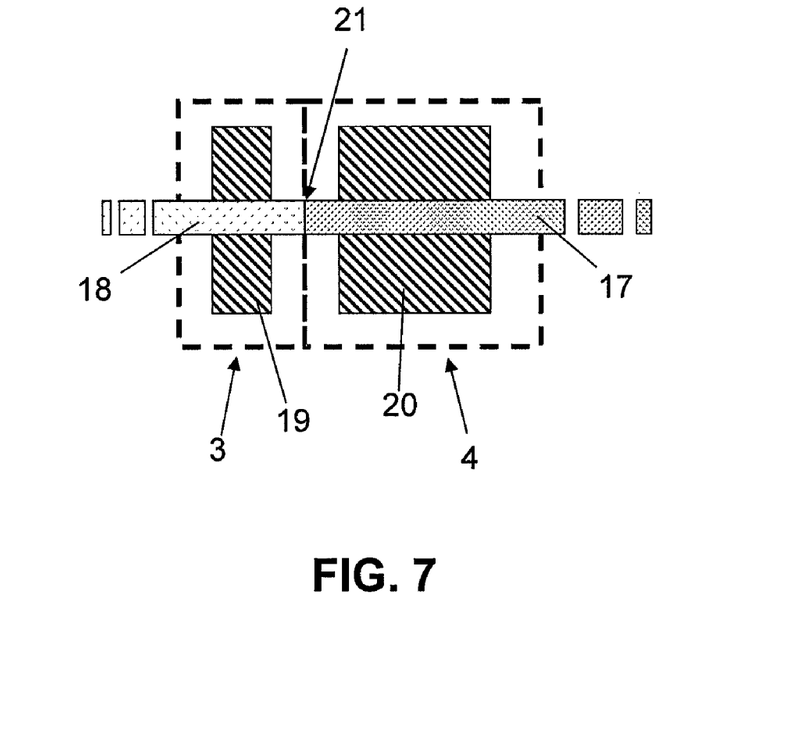
FIG. 7 to 9 illustrate top views of a device according to embodiments of the invention during subsequent steps during manufacturing.

FIG. 7 schematically shows a top view of the device according to embodiments of the invention after formation of the fully silicidized gate electrodes 17, 18. Reference number 19 and 20 indicate the active areas for respectively the NMOS and PMOS device. It can be seen that the different silicides of the silicidized gate electrodes 17 and 18 contact each other at an interface 21, also referred to as silicide interface 21. A drawback hereof is that, during thermal steps in further processing of the device the metal of the silicides may diffuse from the metal rich silicide to the metal poor (silicon rich) silicide. Through this, the constitution of the silicides may change. Hence, the metal rich silicide may lose metal and the metal poor silicide (silicon rich) may gain metal. When the constitution of the silicides changes, the workfunction of the silicides may also change, which may lead to a dual workfunction semiconductor device not having the properties as required when manufacturing was started.

For preventing metal to diffuse from one silicide to the other, certain embodiments disclose forming a blocking region (see further) at the silicide interface 21 in between the first and second fully silicidized gate electrodes for preventing diffusion of metal from the metal silicide of one silicidized gate electrode 17 to metal silicide of the other silicidized gate electrode 18.

According to embodiments of the invention, forming a blocking region may be done by implantation of dopant elements with a lower solubility in silicide than the metal the silicide is formed of. The dopant elements may also be referred to as diffusion retarding species, because they retard or substantially prevent diffusion of metal from one silicide to the other. Examples of suitable dopant elements or diffusion retarding species are B, N, C, F, Sc, Si or any other suitable dopant element with a solubility in silicide lower than the metal the silicide is formed of. Implantation of the dopant elements may be performed in a region at the location of the interface 21 between the first and second fully silicidized gate electrode 17, 18 or a blanket implantation may be performed.

Diffusion retarding species can work in different ways. For example, N and C are examples of dopant elements with low solubility in the silicon, such that they segregate at or diffuse to grain boundaries. With low solubility in the silicon is meant that less than 5% of the implanted ions will, after a heating step, remain in the bulk of the silicon. These dopant elements also have a low mobility such that, once they have reached the grain boundaries, they remain at the grain boundaries during further processing steps. The above-described parameters are to be evaluated at normal thermal budgets, i.e. at temperatures lower than the temperature used for the silicide formation, which is dependent on the metal used, e.g. about 500° C., for less than a few hours, e.g. less than about 2 or 3 hours. With the latter is meant that, after silicidation at a particular temperature, e.g. about 500° C., the further process steps may be performed at temperatures not higher than the silicidation temperature, e.g. about 500° C. Another example is B, which is an example of a species that most likely remains in the bulk and diffuses faster than N, C. In this case, process conditions are more critical than in case of N or C because care has to be taken that, once the B elements are diffused into the bulk, they remain in the bulk during further processing of the device.

Figure 8:
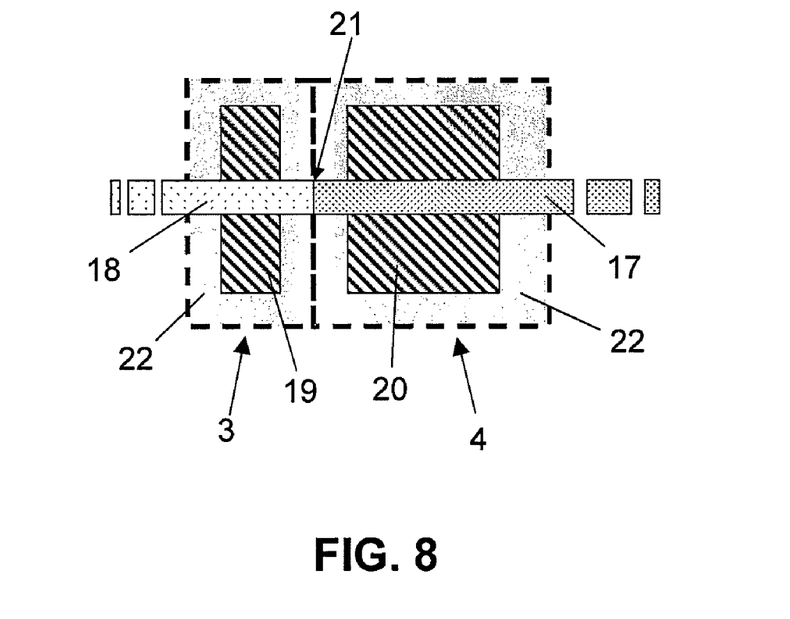

FIG. 8 illustrates local implantation of dopant elements in the silicides 17, 18 at a region at the location of the silicide interface 21. According to this example, the blocking region 23 is to be formed in a region where no transistors will be present, i.e. on top of an isolation zone 2. Therefore, a photolithographic mask 22 is provided which covers the active areas 19 and 20 of the NMOS and PMOS device but exposes a region at the interface 21 between the first and second fully silicidized gate electrodes 17, 18. According to embodiments of the invention, the layout of the mask 22 may comprise an n-well mask and a p-well mask with mask shrinking, or in other words, the layout of the mask 22 can be a combination of the masks used to define respectively the active area 19, 20 of the n-type and p-type devices. These masks are the inverse of each-other, but most likely the corresponding regions on the wafer have small spacing between them. A suitable sequence of process steps may be:

depositing a first resist layer, lithographically patterning the first resist layer through the p-well mask, hereby preferably over-exposing such that the remaining resist area is smaller than the corresponding area on the mask, and depositing a second resist layer, lithographically patterning the second resist layer through the n-well mask, preferably over-exposing such that the remaining resist area is smaller than the corresponding area on the mask.

A strip is created between the resist areas, this strip may be more or less in the middle of the isolation zone 2, the width thereof depending on the spacing between the n-well and the p-well mask and/or over-exposure (i.e. shrinking of lateral dimension of the resist).

Implantation of dopant elements may then be performed. This may be done by classical techniques such as ion implantation, but may also be done by, for example, PLAD (plasma deposition). After implantation, the mask 22 may be removed by any suitable technique known by a person skilled in the art such as e.g. stripping. Because the dopant elements that have been implanted have a lower solubility in the silicide than the metal the silicide is formed of, the dopant elements will, during subsequent heating, diffuse toward grain boundaries of the metal silicides. Depending on the time in the process sequence where implantation of dopant elements is performed, diffusion of the dopant elements in the silicide toward the grain boundaries may occur during existing process steps such as formation of the silicides or further process steps after silicide formation (e.g. anneal and deposition steps in back end of line processing), or may occur during a heating step specifically carried out for obtaining the diffusion of the dopant elements. Preferably, diffusion of the dopant elements may occur at a temperature of around 500° C.

Figure 9:
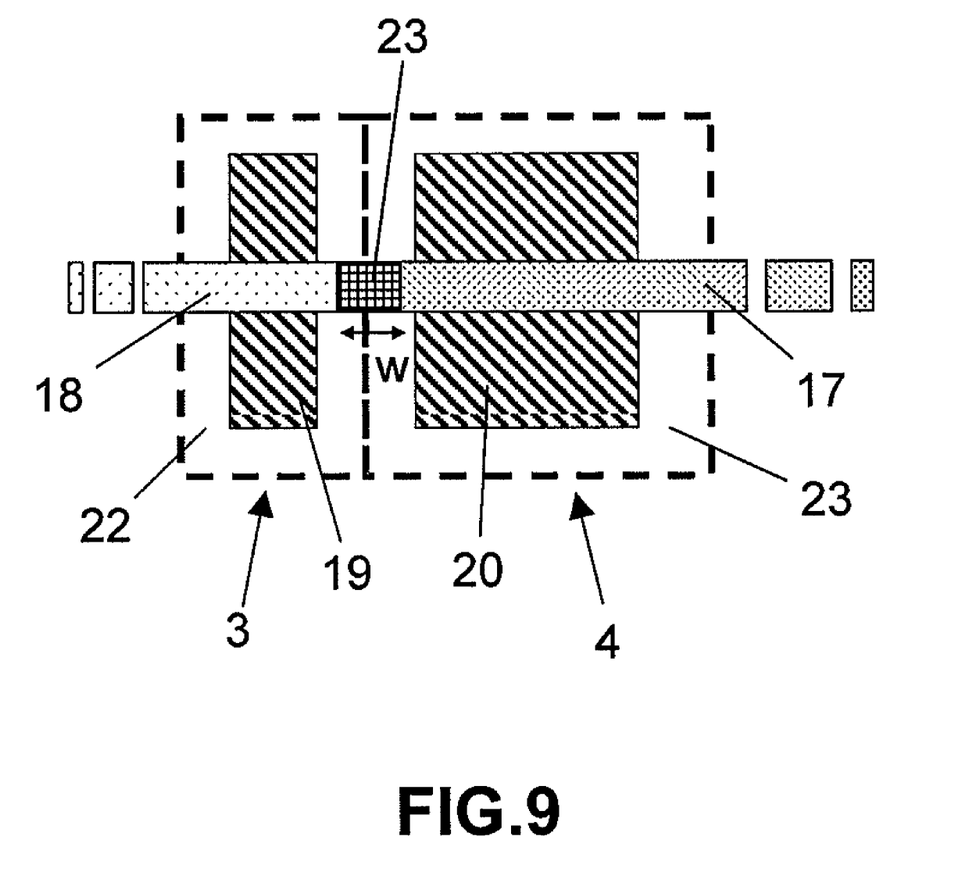

By this diffusion of the dopant elements toward the grain boundaries, at the grain boundaries of the metal silicides at the location of the interface 21 a blocking region 23 is formed (see FIG. 9). This blocking region prevents metal from the metal silicide of one silicidized gate electrode 17 to diffuse to the metal silicide of the other silicidized gate electrode 18 during future temperature steps.

When blanket implantation of dopant elements is performed at the complete area of the silicides, similar as described, because of a heating step, diffusion of the dopant elements towards grain boundaries will occur and a blocking region 23 is formed at the location of the interface 21 between the different silicides. In case of blanket implantation, implantation of the dopant elements may be done uniformly. In case of blanket implantation, no mask is used and implantation is performed at the complete area of the silicides. Hence, it has to be noted that in these cases, the dopant elements and implantation should be such that the workfunction of the silicidized gates 17, 18 is not affected or modified.

According to embodiments of the invention, the blocking region 23 may have the same width as the isolation zone 2. The blocking region 23 may have a width w of between 10 nm and 40 nm. However, in some applications an increase of the resistivity of the silicide may be caused by implantation of the dopant elements or diffusion retarding species. This may have an effect on electrical performance, e.g. speed, of the devices. Therefore, according to other embodiments of the invention, the width of the blocking region 23 may be different from the width of the isolation zone 2. In these cases, a balance has to be found between blocking and resistivity. This may, for example, be done by adapting the concentration of dopant elements used to form the blocking region.

According to embodiments of the invention, implantation of the dopant elements in the silicides may be performed before, after or during silicidation of the gate electrodes 9, 10. Implantation of dopant elements after silicidation of the gate electrodes 9, 10 was described above. In case implantation of dopant elements is performed before silicidation of the gate electrodes 9, 10, implantation may be performed before deposition of the metal layer 16, or in other words directly in the polysilicon 8 of the gate electrodes 9, 10, or may be performed after deposition of the metal layer 16, through this metal layer 16. According to alternative embodiments, dopant elements may already be present in the polysilicon layer that is deposited before the gate electrodes 9, 10 are formed.

Nevertheless, in all cases, the dopant elements will, because of the lower solubility in the silicide than the metal the silicide is formed of, diffuse towards grain boundaries of the silicide and in that way prevent diffusion of the metal of the silicide from the one to the other silicide.

It is to be understood that although certain embodiments, specific constructions and configurations, as well as materials, have been discussed herein for devices according to the present invention, various changes or modifications in form and detail may be made without departing from the scope and spirit of this invention.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of manufacturing a dual workfunction semiconductor device comprising:
    forming on a substrate a first and second control electrode, the first control electrode being formed of a metal-semiconductor compound having a first workfunction and the second control electrode being formed of a metal-semiconductor compound having a second workfunction different from the first workfunction; and
    forming a blocking region preventing diffusion of metal between the metal-semiconductor compound of the first control electrode and the metal-semiconductor compound of the second control electrode, the blocking region being formed at a location where an interface at which the first control electrode is in contact with the second control electrode is formed or to be formed, the blocking region being formed by implantation of dopant elements having a solubility in the metal-semiconductor compound lower than the solubility of the metal in the metal-semiconductor compound.

2. A method of manufacturing a dual workfunction semiconductor device comprising:
    forming on a substrate a first and second control electrode, the first control electrode being formed of a metal-semiconductor having a first workfunction and the second control electrode being formed of a metal-semiconductor compound having a second workfunction different from the first workfunction; and
    forming a blocking region preventing diffusion of metal between the metal-semiconductor compound of the first control electrode and the metal-semiconductor compound of the second control electrode, the blocking region being formed by implantation of dopant elements, the dopant elements having a solubility in the metal-semiconductor compound lower than the solubility of the metal in the metal-semiconductor compound, the blocking region being formed at a location where an interface between the first and second control electrodes is formed or to be formed, the dopant elements being implanted at the interface a) in the first and second control electrodes or b) in a metal layer or a semiconductor layer from which the first control electrode is formed and in a metal layer or a semiconductor layer from which the second control electrode is formed.

3. A dual workfunction semiconductor device comprising:
    a first control electrode formed of a metal-semiconductor compound having a first workfunction;
    a second control electrode formed of a metal-semiconductor compound having a second workfunction; and
    a blocking region located at an interface at which the first control electrode is in contract with the second control electrode and configured to prevent diffusion of metal between the metal-semiconductor compound of the first control electrode and the metal-semiconductor compound of the second control electrode, wherein the blocking region comprises implanted dopant elements having a solubility in the metal-semiconductor compound lower than the solubility of the metal in the metal-semiconductor compound.

4. The method according to claim 1, wherein the forming of a first and second control electrode comprises:
    providing a first and second control electrode each comprising a stack of a dielectric layer and a semiconductor layer;
    thinning the semiconductor layer of one of the first or second control electrode;
    providing a metal layer at least over the first and second control electrodes; and
    thermally reacting the metal layer and the semiconductor layer so as to form the metal-semiconductor compound of the first and second control electrode.

5. The method according to claim 1, wherein the forming of a first and second control electrode comprises:
    providing a first and second control electrode each comprising a stack of a dielectric layer and a semiconductor layer;
    providing a first metal layer with a first thickness on the first control electrode and providing a second metal layer with a second thickness on the second control electrode, the first thickness being different from the second thickness; and thermally reacting the metal layer and the semiconductor layer so as to form the metal-semiconductor compound of the first and second control electrode.

6. The method according claim 1, wherein the dual workfunction semiconductor device comprises a first type of device having an active area and a second type of device having an active area, wherein the implantation of dopant elements comprises:

providing a mask which covers the active areas of the first and second type of device but exposes a region at a location where an interface between the first and second control electrodes is to be formed or is formed; and implanting dopant elements in the region at the location where the interface between the first and second control electrodes is to be formed or is formed.

7. The method according to claim 1, wherein a blanket implantation of dopant elements is performed.

8. The method according to claim 1, wherein the implantation of dopant elements is performed after thermally reacting the metal layer and the semiconductor layer so as to form the metal-semiconductor compound of the first and second control electrodes.

9. The method according to claim 1, wherein the implantation of dopant elements is performed during thermally reacting the metal layer and the semiconductor layer so as to form the metal-semiconductor compound of the first and second control electrodes.

10. The method according to claim 1, wherein implantation of dopant elements is performed with an implantation dose of between about $1E14\ cm^{-2}$ and $1E16\ cm^{-2}$.

11. The method according to claim 1, the dual workfunction semiconductor device comprising an NMOS and a PMOS device, wherein the method further comprises providing isolation zones for electrically isolating the NMOS device from the PMOS device.

12. The method according to claim 1, wherein the dual workfunction semiconductor device comprises a NMOS and a PMOS device, wherein the method further comprises providing a first and second main electrode to the NMOS and the PMOS devices.

13. The method according to claim 1, wherein implantation of dopant elements is performed before thermally reacting the metal layer and the semiconductor layer so as to form the metal-semiconductor compound of the first and second control electrode.

14. The method according to claim 8, wherein the first and second control electrodes each comprising a stack of a dielectric layer and a semiconductor layer, wherein the implantation of dopant elements is performed by implanting dopant elements in the semiconductor layer of the first and second control electrode.

15. The dual workfunction semiconductor device according to claim 3, wherein the blocking region has a width (w) of between about 10 nm and 40 nm.

16. The dual workfunction semiconductor device according to claim 3, wherein the metal-semiconductor compound is a metal silicide.

17. The dual workfunction semiconductor device according to claim 16, wherein the first control electrode comprises $Ni_2Si$ or $Ni_{31}Si_{12}$ and the second control electrode comprises NiSi.

18. The dual workfunction semiconductor device according to claim 16, wherein the block regions are implanted with an implantation dose of between about $1E14\ cm^{-2}$ and $1E16\ cm^{-2}$.

* * * * *